(12) United States Patent
Toro-Lira et al.

(10) Patent No.: US 6,873,175 B2
(45) Date of Patent: Mar. 29, 2005

(54) APPARATUS AND METHOD FOR TESTING PIXELS ARRANGED IN A MATRIX ARRAY

(75) Inventors: Guillermo Toro-Lira, Sunnyvale, CA (US); Makoto Shinohara, Hadano (JP); Takaharu Nishihara, Hadano (JP)

(73) Assignee: Shimadzu Corporation, Kyoto (JP)

(*) Notice: Subject to any disclaimer, the term of this patent is extended or adjusted under 35 U.S.C. 154(b) by 0 days.

(21) Appl. No.: 10/379,458

(22) Filed: Mar. 4, 2003

(65) Prior Publication Data

US 2004/0174182 A1 Sep. 9, 2004

(51) Int. Cl.⁷ .............................................. G01R 31/00
(52) U.S. Cl. ................... 324/770; 324/158.1; 345/205; 349/48
(58) Field of Search .......................... 324/770, 158.1, 324/501, 751, 73.1, 750, 752, 753; 349/48, 41, 54; 345/204–206, 30, 32, 35; 438/17, 18; 250/304, 305, 397, 492.2; 257/48; 445/63, 3

(56) References Cited

U.S. PATENT DOCUMENTS

| | | | |
|---|---|---|---|
| 4,870,357 A | * 9/1989 | Young et al. | ............... 324/770 |
| 5,504,438 A | * 4/1996 | Henley | ......................... 324/770 |
| 5,982,190 A | * 11/1999 | Toro-Lira | ..................... 324/770 |
| 6,033,281 A | 3/2000 | Toro-Lira | |
| 6,075,245 A | 6/2000 | Toro-Lira | |

* cited by examiner

Primary Examiner—David Zarneke
Assistant Examiner—Jimmy Nguyen
(74) Attorney, Agent, or Firm—Rankin, Hill, Porter & Clark LLP (57) ABSTRACT

An apparatus for testing plural pixels arranged in a matrix array on a TFT substrate comprises an electron gun for incidenting the electron beam to the TFT substrate, a secondary electron detector for detecting the amount of secondary electrons generated by incidenting the electron beam to the TFT substrate, and a stage for carrying the TFT substrate which is held thereon. The electron gun is placed against the TFT substrate held on the stage and incidents the electron beam to each basic scanning area. The electron gun scans the electron beam in one basic scanning area a predetermined number of times to obtain a secondary electron waveform necessary for testing the presence/absence of a defect in the pixel. The stage is always moved while the electron gun scans the electron beam in each basic scanning area, whereby the entire area of the TFT substrate is tested.

16 Claims, 10 Drawing Sheets

APPARATUS AND METHOD FOR TESTING PIXELS ARRANGED IN A MATRIX ARRAY

1. FIELD OF THE INVENTION

The present invention relates to an apparatus and method for testing plural pixels arranged in a matrix array.

2. DESCRIPTION OF THE RELATED ART

A flat panel display (FPD) is a display device for displaying electronic information. An example of the flat panel display (FPD) popularly used in the recent years is a liquid crystal display (LCD) using thin film transistors (TFTs). The liquid crystal display using the TFTs is used in a high-performance laptop computer or the like.

The configuration and operation of the liquid crystal display using the TFTs will be described below. As the basic structure, the liquid crystal display using the TFTs has a liquid crystal panel formed in such a manner that liquid crystal is poured between one glass substrate having TFTs and pixel electrodes formed thereon and the other glass substrate having counter electrodes formed thereon.

Figure 10:
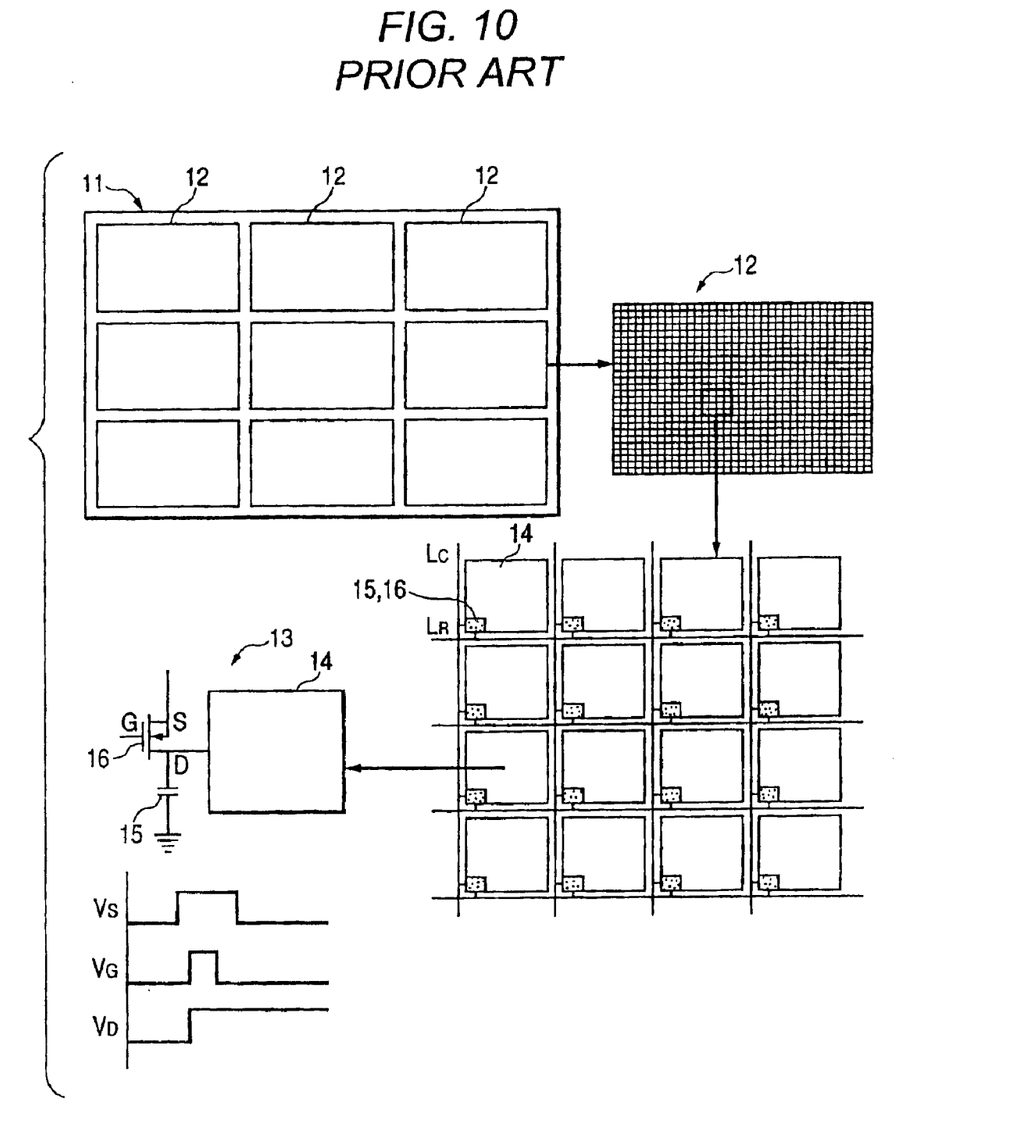
FIG. 10 is a schematic drawing showing a glass substrate having TFTs and pixel electrodes formed thereon.

FIG. 10 is a schematic drawing showing a glass substrate on which TFTs and pixel electrodes are formed. In FIG. 10, a single glass substrate 11 has a plurality of panels 12 formed by a general process of manufacturing integrated circuits. Each of the panels 12 is constituted by a plurality of pixels 13 arranged in a matrix array.

Each of the pixels 13 composes a pixel electrode 14, a storage capacitor 15, and a TFT 16. The pixel electrode 14 is made of a light-transmissive material with an electric conductivity. Generally, the pixel electrode 14 is made of ITO (indium tin oxide). The storage capacitor 15 has an electrode to which a reference voltage of the pixel 13 is applied. This electrode is grounded. That is, the reference voltage of each TFT 16 is set at a ground level. The TFT 16 functions as a switch. The TFT 16 has a gate electrode G supplied with a row selection signal $L_R$ for performing switching control, and a source electrode S supplied with a column selection signal $L_C$ as a data signal.

When a voltage $V_G$ is applied to the gate electrode G of the TFT 16 (i.e., a row selection signal $L_R$ is supplied) while a voltage $V_S$ is applied to the source electrode S of the TFT 16 (i.e., a column selection signal $L_C$ is supplied) at the time of driving of each pixel 13, the TFT 16 is switched on to increase a drain voltage $V_D$. During that time, the storage capacitor 15 is charged to hold the drain voltage $V_D$ until the next refreshing cycle. By repeating this process to all the pixels 13, the orientation of liquid crystal molecule between the two glass substrates is controlled so that a two-dimensional image is displayed on the liquid crystal display.

For inspecting the glass substrate forming TFTs and pixel electrodes (hereinafter referred to as "TFT substrate"), there has been proposed a method for non-contact classification of each pixel condition on the substrate based on a voltage waveform contrast technique using an electron beam (U.S. Pat. No. 5,982,190). The TFT substrate testing method using the voltage wave form contrast technique has an advantage that this method is more inexpensive than any related-art testing method using a mechanical probing technique and is higher in testing speed than any optical testing method.

Figure 11:
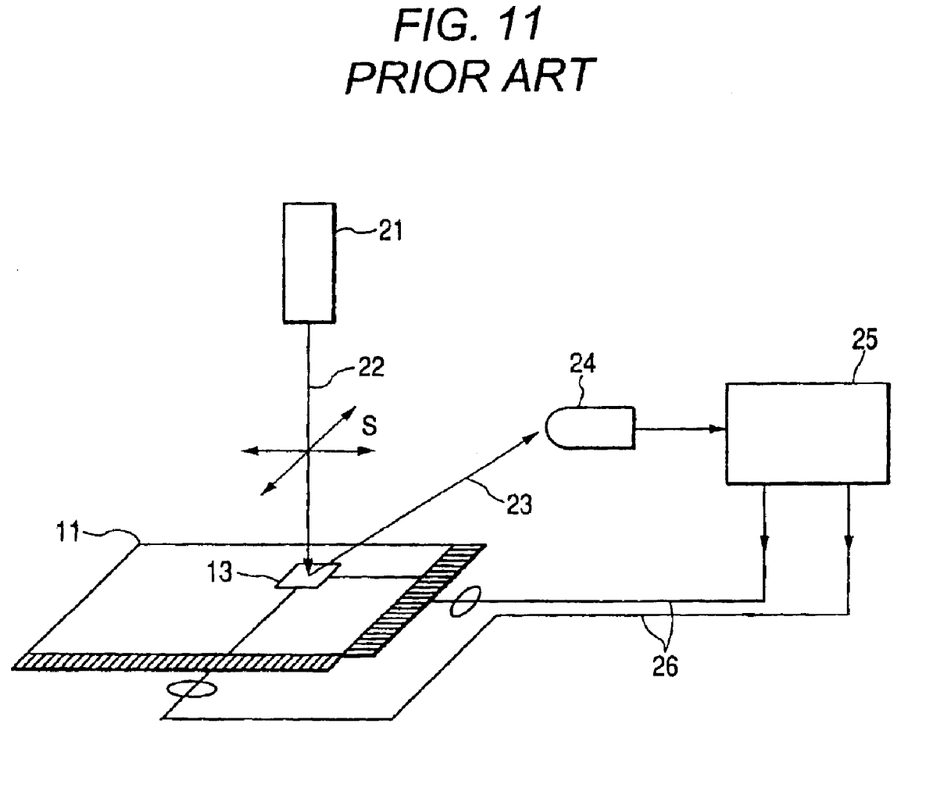
FIG. 11 is a drawing for explaining a method for testing a TFT substrate by a voltage waveform contrast technique.

FIG. 11 is a diagram for explaining a TFT substrate testing method using a voltage waveform contrast technique. This testing method is carried out in a high-vacuum chamber. A TFT substrate to be tested is transferred to the high-vacuum chamber and set on a stage. In this condition, the TFT substrate is tested.

In FIG. 11, the testing apparatus includes an electron beam source 21, a secondary electron detector 24, and a signal analyzer (computer system or the like) 25. The electron beam source 21 generates an electron beam 22 with which each pixel 13 of the TFT substrate 11 is irradiated. The secondary electron detector 24 detects secondary electrons 23 generated by irradiation of the electron beam 22 to each pixel 13 of the TFT substrate 11. The secondary electron detector 24 outputs a signal indicating a waveform corresponding to the voltage waveform of the pixel 13 on the basis of the amount of the detected secondary electrons 23 and sends the signal to the signal analyzer 25. The signal analyzer 25 analyzes the output signal of the secondary electron detector 24 and checks each pixel condition, especially the presence/absence of a defect in the pixel and the details of the defect. The signal analyzer 25 includes a drive signal supply unit by which drive signals for driving TFT of each pixel 13 on the TFT substrate 11 is output through lines 26. Supply of the drive signals is synchronized with scanning of the TFT substrate 11 using the electron beam 22 generated by the electron beam source 21 in directions represented by the arrows S in FIG. 11.

The principle of the voltage waveform contrast technique based on the amount of detected secondary electrons will be described below.

The amount of secondary electrons 23 emitted from each pixel 13 of the TFT substrate 11 depends on the polarity of the voltage of the pixel 13 of the TFT substrate 11. When, for example, a pixel 13 in the TFT substrate 11 is driven positively, secondary electrons 23 emitted on the basis of irradiation of the pixel 13 with an electron beam 22 are attracted to the pixel 13 because the secondary electrons 23 have negative electric charges. As a result, the amount of the secondary electrons 23 reaching the secondary electron detector 24 is reduced.

On the other hand, when a pixel 13 in the TFT substrate 11 is driven negatively, secondary electrons 23 emitted on the basis of irradiation of the pixel 13 with an electron beam 22 repel the pixel 13 because the secondary electrons 23 have negative electric charges. As a result, the secondary electrons 23 emitted from the pixel 13 reach the secondary electron detector 24 without reduction in the amount of the secondary electrons 23.

In this manner, the secondary electron waveform corresponding to the voltage waveform of the pixel 13 can be measured on the basis of the fact that the amount of the detected secondary electrons 23 emitted from the pixel 13 depends on the polarity of the voltage of the pixel 13. That is, it is possible to obtain the voltage waveform of the pixel 13 indirectly. The waveform corresponding to the voltage waveform of the pixel 13 is hereinafter referred to as a secondary electron waveform of the pixel.

This secondary electron waveform of the pixel 13 needs to be measured for each pixel 13 for a predetermined period to test accurately the condition of the pixel 13 using the signal analyzer 25. For example, in a case of testing a weak leak of electric charges from the pixel electrode 14 of the pixel 13, it is desirable to apply the voltage to the pixel 13 for a period in the order of several tens ms, or from 20 to 40 ms, for example.

Therefore, in a testing method using the related-art testing apparatus, an electron gun 21 is disposed and fixed on the pixel 13 to be tested, and applies the electron beam 22 to the same pixel 13 for a predetermined period, for example, at every 1.8 ms. The irradiation of the electron beam 22 is made to the same pixel for a period of 10 ms or more to produce the secondary electron waveform necessary for testing the presence/absence of a defect in the pixel 13. The secondary electron detector 24 detects the amount of secondary electrons 23 generated from the pixel 13 by the irradiation of the electron beam 22 in synchronism with the electron beams can of the electron gun 21 at every 1.8 ms. The secondary electron detector 24 outputs to the signal analyzer 25 a signal of the secondary electron waveform corresponding to the voltage waveform of the pixel 13 on the basis of the detection amount of the secondary electrons 23 detected for the same pixel 13 for a period of 10 ms or more.

The total data acquisition time for all the pixels on the TFT substrate using the above testing method is obtained in the following manner. Herein, the TFT substrate is a glass substrate having a size of 680×880 mm$^2$ with a-TFT array for LCD formed thereon. For the simpler calculation, it is supposed that plural pixels each having a size of 300×100 $\mu$m$^2$ are arranged in a matrix array on the entire area of the glass substrate.

First of all, when the secondary electron waveform of the pixel at one position per pixel is obtained, the total number of secondary electron waveforms (corresponding to the total number of pixels herein) over the entire area of the glass substrate is equal to (680/0.1)×(880/0.3)=1994666. If the secondary electron waveform at the same position is measured for a period of 10 ms the total data time over the entire area of the glass substrate is equal to 0.01 s×1994666/3600= about 55.4 hours. Accordingly, when the entire area of one TFT substrate is tested employing the related-art testing method, it takes several days.

In the actual test, the electron beam is applied to the same pixel at every about 1.8 ms, and by 20 times in total to measure the secondary electron waveform required to test the presence/absence of a defect in the pixel. In this case, the data acquisition time for one position per pixel is equal to 1.8 ms×20=36 ms, and the total data acquisition time over the entire area of the glass substrate is equal to 0.036 s×1994666/3600=about 199.5 hours.

However, for the practical testing apparatus, it is required to complete the testing of one substrate for a period in the order of minutes. In the future, it is expected that the size of the TFT substrate is further increased. Thus, it is desired for the related-art testing apparatus using a voltage waveform contrast technique to shorten the electron beam scan time.

In producing the secondary electron waveform for a predetermined period required to test the presence/absence of a defect in the pixel, the electron gun is stopped at one pixel for a long time to apply the electron beam to the pixel, and an irradiation duration of one pixel with the electron beam becomes longer, resulting in a problem that the pixel is damaged by the irradiation of the electron beam.

SUMMARY OF THE INVENTION

An object of the present invention is to provide an apparatus and method for testing plural pixels arranged in a matrix array.

In order to achieve the above object, the present invention provides a method for testing plural pixels arranged in a matrix array, including the steps of setting a scanning area containing at least one pixel on a substrate having the plural pixels formed thereon, scanning the scanning area at least once or more by irradiating the pixel in the scanning area with an electron beam from an electron beam source unit, and detecting secondary electrons generated from the pixel by the irradiation of the electron beam.

At this time, the scanning step preferably includes scanning the scanning area multiple times, which is indispensable to produce the secondary electron waveform. More preferably, the scanning step includes scanning the scanning area twenty times or more.

The testing method may further include a step of moving relatively the electron beam source unit and the substrate, wherein the scanning area setting step includes setting a plurality of scanning areas each containing at least one pixel or more on the substrate, and every time the scanning step and the detecting step are ended for each of the plurality of scanning areas, the relative movement step is made to perform the scanning step and the detecting step for other scanning areas.

Also, the testing method may further include a step of moving relatively the electron beam source unit and the substrate, wherein the scanning area setting step includes setting a plurality of scanning areas each containing at least one pixel or more on the substrate, and the relative movement step moves the substrate relative to the electron beam source unit, while performing the scanning step for each of the plurality of scanning areas.

In this testing method, the scanning step preferably includes applying the electron beam to a plurality of different irradiation positions within one pixel. For example, to produce four pieces of the secondary electron waveform data within one pixel having a size of 300×100 $\mu$m$^2$, a sampling pitch of electron beam irradiation is 300 $\mu$m/2 in vertical and 100 $\mu$m/2 in horizontal.

Also, in the testing method, the scanning area setting step may include setting a plurality of scanning areas each containing at least one pixel or more on the substrate, and the scanning step may include enabling a plurality of the electron beam source units to scan the plurality of scanning areas corresponding to the plurality of the electron beam source units.

The substrate is preferably a TFT substrate on which pixels having a TFT and a pixel electrode are arranged in a matrix array on a glass substrate.

Also, the testing method may further include a step of supplying a drive signal to the pixels in the scanning area, wherein the scanning step includes scanning the pixels in the scanning area driven at the drive signal supplying step by multiple times, each scanning being made in succession via a writing time. The drive signal supplying step preferably includes supplying a drive signal to the pixels in the scanning area within the writing time.

Moreover, in order to achieve the above object, the present invention provides an apparatus for testing plural pixels arranged in a matrix array, comprising an electron beam source unit for incidenting the electron beam to a scanning area containing at least one pixel or more to scan the scanning area at least once or more, the scanning area being set on a substrate having plural pixels formed thereon, and a secondary electron detector for detecting secondary electrons generated from the pixel by irradiation with the electron beam.

At this time, the electron beam source unit preferably scans the scanning area multiple times, which is indispensable to produce the secondary electron waveform. More preferably, the scanning step includes scanning the scanning area twenty times or more.

The testing apparatus may further comprise a stage for carrying the substrate held on an upper face thereof, wherein the electron beam source unit scans a plurality of scanning areas set on the substrate and each containing at least one pixel or more, and every time the electron beam source unit finishes scanning one of the scanning areas, at least one of the electron beam source unit and the stage is moved.

At this time, the testing apparatus may further comprise a stage for carrying the substrate held on an upper face thereof, wherein while the electron beam source unit scans the scanning areas, at least one of the electron beam source unit and the stage is moved.

At this time, the electron beam source unit preferably incidents the electron beam to a plurality of different irradiation positions within one pixel. For example, to produce four pieces of the secondary electron waveform data within one pixel having a size of 300×100 $\mu m^2$, a sampling pitch of electron beam irradiation is 300 $\mu m/2$ in vertical and 100 $\mu m/2$ in horizontal.

Moreover, the electron beam source unit may comprise a plurality of the electron beam generators to scan the plurality of scanning areas set on the substrate and each containing at least one pixel.

At this time, the substrate is preferably a TFT substrate on which the pixels having a TFF and a pixel electrode are arranged in a matrix array on a glass substrate.

The testing apparatus may further comprise a drive signal source unit for supplying a drive signal to the pixels in the scanning area, wherein the electron beam source unit scans the pixels in the scanning area driven by the drive signal source unit by multiple times, each scanning being made in succession via a writing time. Further, the drive signal source unit preferably supplies a drive signal to the pixels in the scanning area within the writing time.

In the testing apparatus and method of the above constitution, the electron beam is applied to at least one pixel or more in the scanning area set on the substrate to scan the scanning area, whereby the irradiation time of the electron beam per pixel can be shortened to prevent the pixel from being damaged by irradiation of the electron beam for a long time. Also, the scanning area is scanned multiple times, whereby the secondary electron waveform can be acquired for a period necessary to test the pixel, so that the total data acquisition time or the testing time over the entire area of the TFT substrate can be shortened.

Also, one of the electron beam source unit or the stage is moved, or both are moved at the same time, while the scanning area of the substrate is scanned with the electron beam, whereby there is no need of including the acceleration or deceleration time occurring when the electron beam source unit or the stare is moved, so that the total testing time over the entire area of the TFT substrate can be further shortened.

Also, employing a plurality of electron beam source units, a plurality of basic scanning areas are scanned with the electron beam at the same time, so that the total data acquisition time or the testing time over the entire area of the TFT substrate can be further shortened.

DETAILED DESCRIPTION OF THE INVENTION

The preferred embodiments of the present invention will be described below in detail with reference to the accompanying drawings. An apparatus and method for testing plural pixels arranged in a matrix array according to the invention can be employed for testing the a-TFT-LCD, p-Si-TFT-LCD, p-Si-TFT array for organic EL (electro luminescence), PDP (plasma display panel) and other substrates for FPD. In this embodiment of the invention, a glass substrate 11 (i.e., TFT substrate) having a size of 680×880 $mm^2$, and having six panels 12 with TFTs and pixel electrodes formed thereon is employed.

Figure 1A:
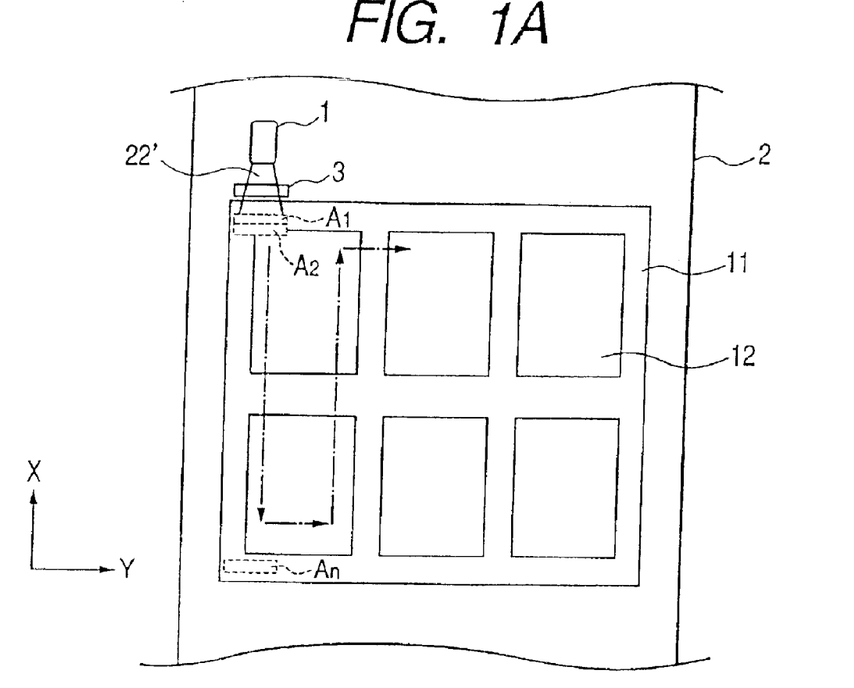
FIG. 1A is a drawing for explaining an apparatus for testing plural pixels arranged in a matrix array according to a first embodiment of the present invention.
Figure 1B:
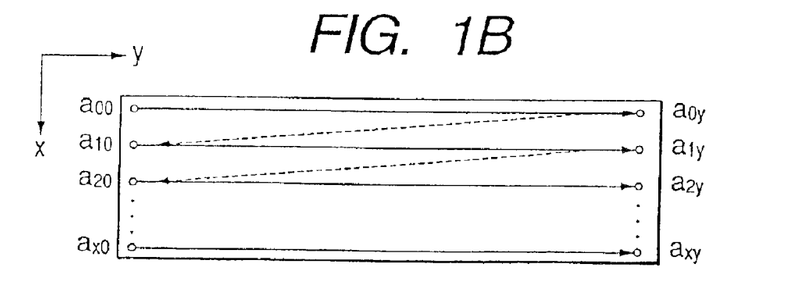
FIG. 1B is a drawing for explaining the electron beam scanning over a basic scanning area A.
Figure 1C:
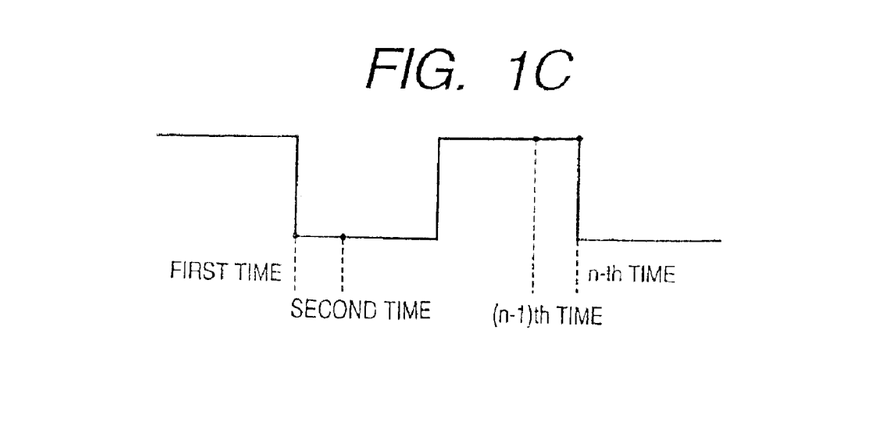
FIG. 1C is a chart showing one example of waveform on the basis of the detection amount of secondary electrons obtained by applying the electron beam to an irradiated position $a_{00}$ in the basic scanning area A as shown in FIG. 1B.

FIG. 1A is a drawing for explaining an apparatus for testing plural pixels arranged in a matrix array according to a first embodiment of the invention. FIG. 1B is a drawing for explaining the electron beam scanning over a basic scanning area A. FIG. 1C is a chart showing one example of waveform on the basis of the detection amount of secondary electrons obtained by applying the electron beam to an irradiated position $a_{00}$ in the basic scanning area A as shown in FIG. 1B. Incidentally, the testing apparatus has the same constitution as that of the related-art testing apparatus. Hence, the same or like parts are designated by the same numerals and the description of those parts is omitted.

As shown in FIG. 1A, the testing apparatus according to the first embodiment of the invention comprises an electron gun 1 for irradiating the electron beam to the TFT substrate 11, a secondary electron detector 3 for detecting the amount of secondary electrons generated by irradiating the electron beam to the TFT substrate 11, and a stage 2 for carrying the TFT substrate 11 which is held thereon.

The electron gun 1 is placed against the TFT substrate 11 held on the stage 2 and irradiates the electron beam to each basic scanning area A (A1, A2, . . . ). In FIG. 1A, reference numeral 22' denotes an electron beam scanning range of the electron gun 1. Herein, the basic scanning area A is decided depending on the number of electron beam irradiating points (sampling number) within the basic scanning area A (e.g., 3×45 mm$^2$). Also, the electron gun 1 irradiates the electron beam to one basic scanning area A a predetermined number of times to obtain a secondary electron waveform necessary for testing the presence/absence of a defect in the pixel.

The stage 2 is moved in an opposite direction to the testing direction (as indicated by the arrow of the dotted line in the figure) if the electron gun 1 finished scanning the electron beam in the first basic scanning area A1. Then, the electron gun 1 scans the electron beam to the next basic scanning area A2. Namely, every time the electron gun 1 finishes scanning the electron beam in each basic scanning area A, the stage 2 is moved, whereby the entire area of the TFT substrate 11 is tested.

As used herein, the "testing direction" means a direction where the testing for the TFT substrate 11 is performed using the electron gun 1. In this embodiment, this testing direction is a direction where the electron gun 1 and the electron detector 3 are moved over the TFT substrate 11 along with the movement of the stage 2.

That is, when the basic scanning area A has a size of 3×45 mm$^2$, the stage 2 is moved by 3 mm in the X direction (upward in the figure), if the electron gun 1 finishes scanning the electron beam in the basic scanning area A1. Thereby, the electron gun 1 is placed at a position corresponding to the next basic scanning area A2, and starts scanning the electron beam in the next basic scanning area A2. If the electron gun 1 finishes scanning the electron beam in the basic scanning area An (n is a positive integer), namely, once the testing for the TFT substrate 11 in the X direction completes, the stage 2 is moved by 45 mm in a direction perpendicular to the X direction, or the Y direction (left wards in the figure). At that position, the electron gun 1 scans the electron beam in the basic scanning area A against the opposite side of the electron gun 1 in X direction. Then, the stage 2 is moved in an opposite direction (downwards in the figure) to the X direction where the testing is conducted before. In this manner, the electron gun 1 scans the electron beam in the basic scanning area A, whereby the entire area of the TFT substrate 11 is tested by scanning the electron beam.

Referring to FIGS. 1B and 1C, an electron beam scanning method for scanning the basic scanning area A by the use of the electron gun 1 will be described below in detail. In FIG. 1B, $a_{00}$ to $a_{xy}$ (x and y are positive integers) denote the irradiating position of the electron beam in the basic scanning area A. The number suffixed at each irradiating position indicates a row number to the left and a column number to the right.

The electron gun 1 scans the electron beam to the irradiating positions $a_{00}$ to $a_{xy}$ in the basic scanning area A at every 0.1 µs interval to scan each line with the electron beam, as shown in FIG. 1B. More specifically, the electron gun 1 scans the electron beam in each line from an irradiating position $a_{00}$ (upper-left end in the figure) at the first column and the first row to an irradiating position $a_{0y}$ at the y-th column in the right direction in the figure, then returns to an irradiating position $a_{10}$ (under $a_{00}$ at the left end in the figure) at the second row and the first column, and scans the electron beam in each line from an irradiating position $a_{10}$ at the first column and the second row to an irradiating position $a_{1y}$ at the y-th column in the right direction in the figure. By repeating this operation, the entire area of the basic scanning area A is scanned by the electron beam. Namely, the electron gun 1 scans the basic scanning area A with the electron beam in the same manner as the electron beam scanning of a cathode-ray tube for television.

Also, the electron gun 1 scans repeatedly the electron beam in one basic scanning area A with a predetermined number of times, for example, 20 times or more, in order to produce a secondary electron waveform necessary for testing the presence/absence of a defect in the pixel. That is, if the electron gun 1 finishes scanning the electron beam in each line from an irradiating position $a_{00}$ at the first column and the first row to an irradiating position $a_{xy}$ at the x-th row and the y-th column, it returns to an irradiating position $a_{00}$ at the first row and the first column to repeat the same scanning with the electron beam. By repeating this operation n times (n is a positive integer), it is possible to produce the secondary electron waveform on the basis of the detection amount of secondary electrons corresponding to the voltage waveform of pixel at each position in the basic scanning area A for a desired period, as shown in FIG. 1C.

The total data acquisition time or the testing time over the entire area of the TFT substrate with the testing apparatus according to the first embodiment of the invention will be described below. Herein, for the simple calculation, plural pixels each having a size of 300×100 µm$^2$ are arranged in a matrix array on the entire area of the glass substrate having a size of 680×880 mm$^2$.

Supposing that the basic scanning area A is 3×45 mm$^2$, and the interval of electron beam radiation is 0.1 µs, when the voltage waveform is obtained at one position (i.e., one irradiating position) per pixel, the total number of secondary electron waveforms (corresponding to the number of pixels herein) in the basic scanning area A is equal to (45/0.1)×(3/0.3)=4500. The data acquisition time of scanning the electron beam over the basic scanning area A at a time is equal to 0.0001 ms×4500=0.45 ms. Also, when the scanning of the basic scanning area A with electron beam is repeated twenty times (i.e., twenty pieces of data are acquired at one position per pixel), the data acquisition time is equal to 0.45 ms×20= 10 ms. This result reveals that the voltage waveform for a period of 10 ms is produced at one position per pixel. The glass substrate having a size of 680×880 mm$^2$ has (680× 880)/(3×45)=4432.6 basic scanning areas A having a size of 3×45 mm. Accordingly, the total data acquisition time for the entire area of the glass substrate is equal to 4432.6×0.01 s=about 44.3 seconds. Thus, the testing time can be significantly shorter than the total data acquisition time of the related-art testing apparatus (about 55.4 hours).

In the actual test, the secondary electron waveforms are obtained at a total of four positions including two positions in length and width per pixel, and the testing for a defect in the pixel is made on the basis of these secondary electron waveforms. In this case, the total number of voltage waveforms in the basic scanning area A is equal to 4500×4= 18000, and the total data acquisition time for the entire area of the glass substrate is equal to 18000×0.001 ms=1.8 ms. When the scanning of the basic scanning area A with the electron beam is repeated twenty times, the data acquisition time is equal to 1.8 ms×20=36 ms. This result reveals that it is possible to acquire the data at 18000 positions in the basic scanning area A for a radiation interval (1.8 ms) of the electron beam at one position of each pixel with the related-art testing apparatus. Also, this result reveals that it is possible to acquire twenty pieces of data at each of 18000 positions in the basic scanning area A for a data acquisition time (36 ms) for twenty pieces of data at one position of each pixel with the related-art testing apparatus. The sampling pitch of electron beam radiation is equal to 100 μm/2 in a transverse direction and 300 μm/2 in a longitudinal direction.

Since the glass substrate of 680×880 mm² has (680×880)/(3×45)=4432.6 basic scanning areas A, the total data acquisition time for the entire area of the glass substrate is equal to 4432.6×36 ms=about 160 seconds. Even if four secondary electron wave forms per pixel are acquired, the testing time can be significantly shorter than the total data acquisition time with the related-art testing apparatus.

Though the electron beam is radiated for a period from the irradiating position $a_{00}$ at the first row and first column back to the irradiating position $a_{10}$ at the second row and first column (same for other irradiating positions) in the basic scanning area A, or from the irradiating position $a_{xy}$ at the x-th row and y-th column back to the irradiating position $a_{00}$ at the first row and first column, the detection amount of secondary electrons detected for this period is canceled. That is, the secondary electron wave form corresponding to the voltage waveform of pixel is formed on the basis of the data for the detection amount of secondary electrons generated from the irradiating position $a_{00}$ to $a_{mn}$. Also, a retrace time from the irradiating position $a_{0n}$ at the first row and first column back to the irradiating position $a_{10}$ at the second row and first column (same for other irradiating positions), or from the irradiating position $a_{xy}$ at the x-th row and y-th column back to the irradiating position $a_{00}$ at the first row and first column is about 2 μs. Accordingly, one actual scan time of the basic scanning area A with the electron beam is the time containing the return time. However, even if this return time is contained, this constitution of the invention has a shorter testing time than the related-art constitution.

With the testing apparatus and method according to the first embodiment of the invention, the irradiation duration of the electron beam per pixel can be shorter to prevent a damage in the pixel from occurring due to irradiation with the electron beam for a long time by scanning the electron beam within the basic scanning area. Also, the secondary electron signal waveform necessary for testing the pixel can be acquired by repeating the scanning of the electron beam, and the total data acquisition time or the testing time over the entire area of the TFT substrate can be shortened.

In the first embodiment, every time the electron gun finishes scanning the electron beam in the basic scanning area A, the stage is moved and the electron gun is placed at a position corresponding to the next basic scanning area A. However, besides that, under the control of a control device, every time the scanning of the electron beam over the basic scanning area A is ended, the electron gun and the secondary electron detector can be moved.

Further, in the first embodiment, one electron gun is provided, but the testing apparatus may have a plurality of electron guns. When a plurality of electron guns are provided, the testing time can be further shortened, as described below.

An apparatus for testing plural pixels arranged in a matrix array using a plurality of electron guns according to a second embodiment of the invention will be described below. The testing apparatus according to the second embodiment of the invention is different from that of the first embodiment only in the respect that a plurality of electron guns are provided. Incidentally, the testing apparatus has the same constitution as that of the related-art testing apparatus. Hence, the same or like parts are designated by the same numerals arid the description of those parts is omitted.

Figure 2:
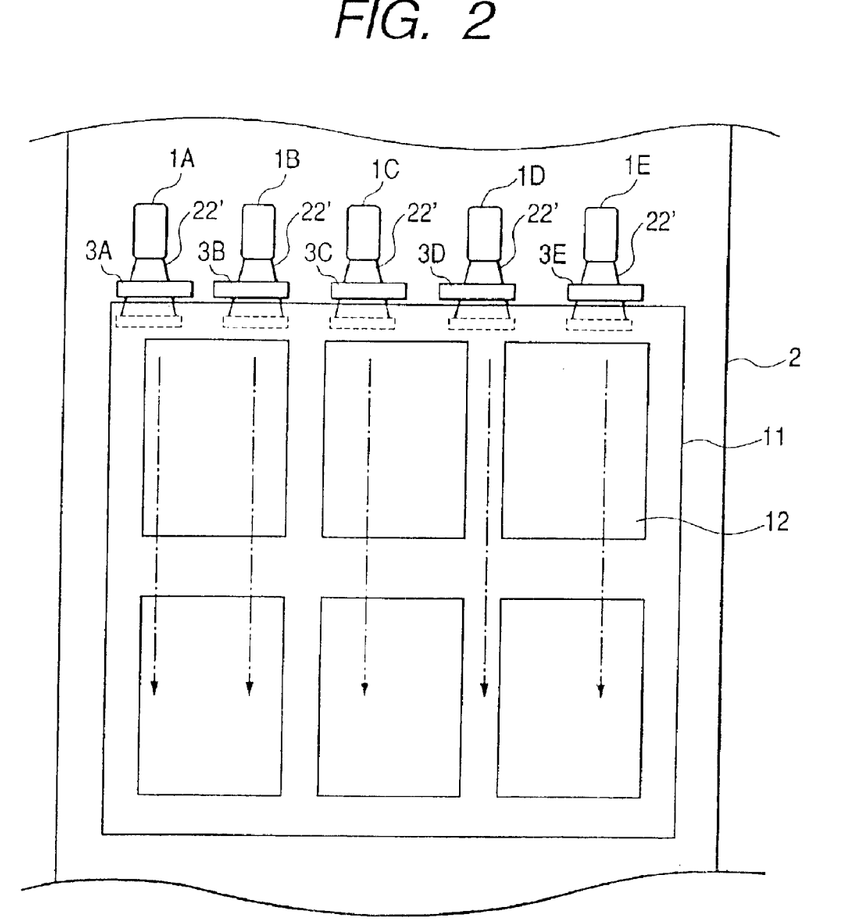
FIG. 2 is a drawing for explaining an apparatus for testing plural pixels arranged in a matrix array employing a plurality of electron guns according to a second embodiment of the invention.

FIG. 2 is a drawing for explaining the apparatus for testing plural pixels arranged in a matrix array using a plurality of electron guns according to the second embodiment of the invention.

FIGS. 3A to 3D are drawings for explaining the testing routes of a plurality of electron guns according to the second embodiment of the invention. FIGS. 4A to 4D are drawings showing a screen of a display portion for displaying the testing areas of a plurality of electron guns which are formed on the basis of the detection amount of secondary electrons detected by a plurality of secondary electron detectors according to the second embodiment of the invention. In FIGS. 3A to 3D, the secondary electron detector and the basic scanning area are omitted for simplification.

As shown in FIG. 2, the testing apparatus according to the second embodiment of the invention comprises five electron guns 1A, 1B, 1C, 1D and 1E for incidenting the electron beam to the TET substrate 11, five secondary electron detectors 3A, 3B, 3C, 3D and 3E, provided corresponding to the electron guns 1A, 1B, 1C, 1D and 1E, for detecting the amount of secondary electrons generated by irradiation of the TFT substrate 11 with the electron beam, and a stage 2 for carrying the TFT substrate 11 that is held thereon. The electron guns 1A, 1B, 1C, 1D and 1E are spaced apart by 180 mm.

The electron guns 1A, 1B, 1C, 1D and 1E are disposed against the TFT substrate 11 held on the stage 2 and scan the electron beam in the basic scanning area A of 3×45 mm². Herein, reference numeral 22' in the drawings denotes the electron beam scanning range for the electron guns 1A, 1B, 1C, 1D and 1E. Also, the electron guns 1A, 1B, 1C, 1D and 1E scan the electron beam in one basic scanning area A by a predetermined number of times repeatedly to produce a voltage waveform necessary for testing the presence/absence of a defect in the pixel.

Figure 3A:
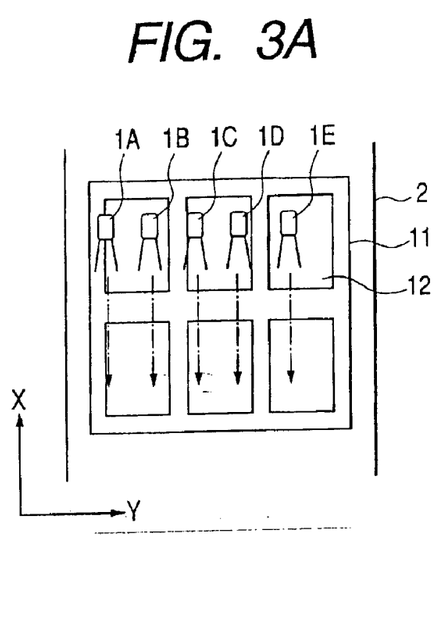
FIGS. 3A to 3D are drawings for explaining the testing routes of a plurality of electron guns according to the second embodiment of the invention.
Figure 3B:
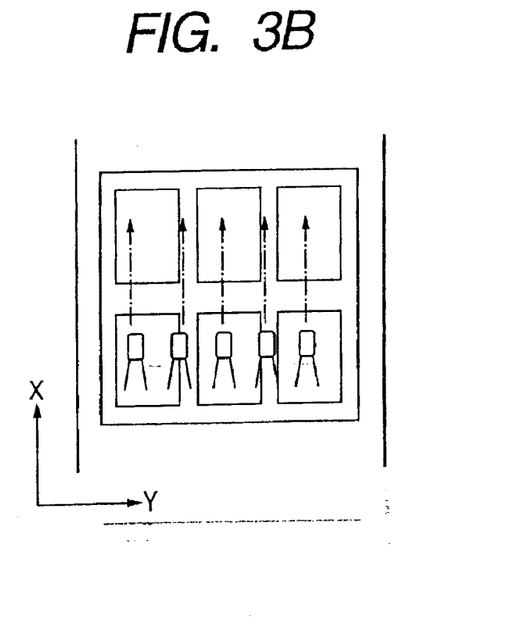
Figure 3C:
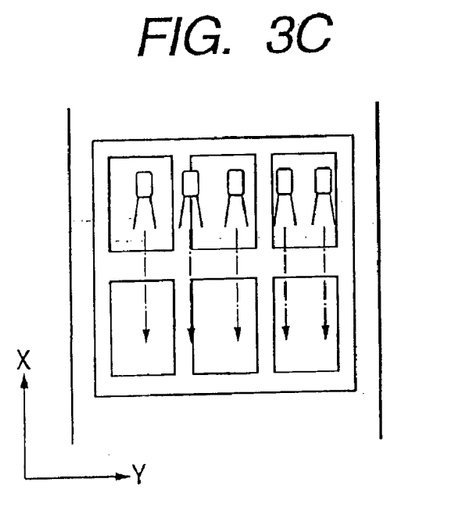
Figure 3D:
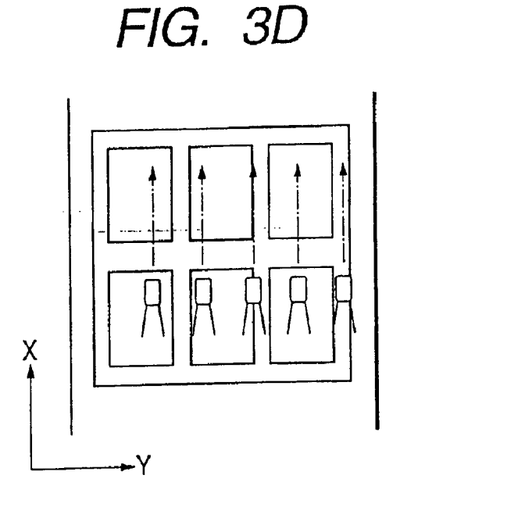
Figure 4A:
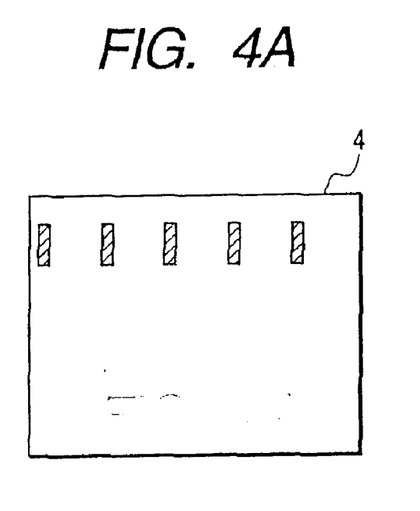
FIGS. 4A to 4D are drawings showing a screen of a display portion for displaying the testing areas of a plurality of electron guns which are formed on the basis of the detection amount of secondary electrons detected by a plurality of secondary electron detectors according to the second embodiment of the invention.

That is, the stage 2 is moved by 3 mm in the X direction (upwards in the figure), every time the electron guns 1A, 1B, 1C, 1D and 1E finish scanning the electron beam in-the basic scanning area A in the same manner as in the first embodiment, as shown in FIGS. 3A to 3D. Thereby, the electron guns 1A, 1B, 1C, 1D and 1E are placed at the positions corresponding to the next basic scanning area A, and scans the electron beam in the next basic scanning area A (FIG. 3A). By repeating this operation, the testing areas (indicated by the oblique line), 45 mm wide, for the electron guns 1A, 1B, 1C, 1D and 1E are displayed on a display portion 4 of the testing apparatus, as shown in FIG. 4A.

Figure 4B:
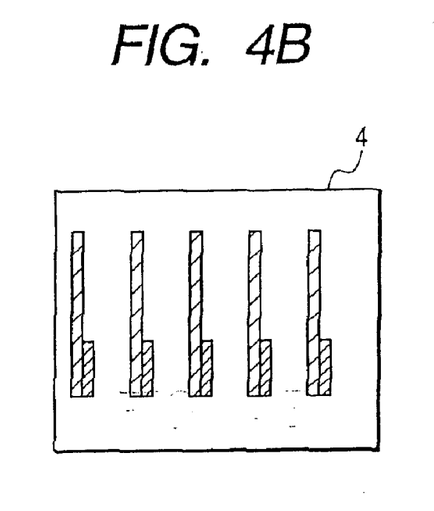
Figure 4C:
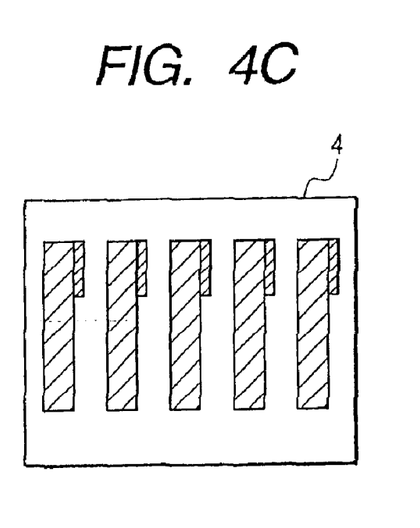
Figure 4D:
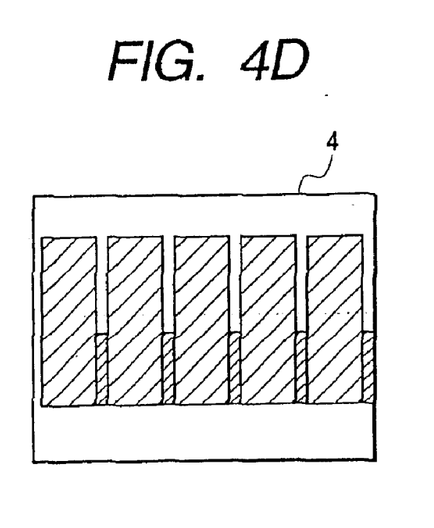

If the electron guns 1A, 1B, 1C, 1D and 1E complete the testing for the TFT substrate 11 in the X direction once, the stage 2 is moved by 45 mm in a direction perpendicular to the X direction, or the Y direction (left wards in the figure). At that position, the electron guns 1A, 1B, 1C, 1D and 1E scan the electron beam in the basic scanning area A to which the electron guns 1 are opposed. The stage 2 is moved in an opposite direction (downwards in the figure) to the X direction where the testing is conducted before. In this manner, the electron guns 1A, 1B, 1C, 1D and 1E scan the electron beam in the basic scanning area A in succession (FIG. 3B). By repeating this operation, the testing areas (indicated by the oblique line), 45 mm wide, for the electron guns 1A, 1B, 1C, 1D and 1E are displayed on the display portion 4 of the testing apparatus, as shown in FIG. 4B.

Since the electron guns 1A, 1B, 1C, 1D and 1E are spaced apart by 180 mm, the entire area of the TFT substrate (FIGS. 4C and 4D) can be tested by once repeating the above operation (FIGS. 3C and 3D) for the TFT substrate 11 (680 mm in the X direction and 880 mm in the Y direction in the figure) having a size of 680×880 mm².

An electron beam scanning method for scanning the basic scanning area A with the electron beam by the use of the electron gun 1 is made in such a way that the electron guns 1A, 1B, 1C, 1D and 1E scan the electron beam in each line from the irradiating position $a^{00}$ at the first row and first column to the irradiating position $a_{xy}$ at the x-th row and y-th column in the basic scanning area A for every line and repeat this scanning a predetermined number of times in the same manner as in the first embodiment, as shown in FIG. 1B.

The total data acquisition time or the testing time over the entire area of the TFT substrate with the testing apparatus according to the second embodiment of the invention will be described below. Herein, for the simple calculation, plural pixels each having a size of 300×100 $\mu m^2$ are arranged in a matrix array on the entire area of the glass substrate having a size of 680×880 $mm^2$.

Supposing that the basic scanning area A is 3×45 $mm^2$, and the interval of electron beam radiation is 0.1 $\mu s$, when the voltage waveform is obtained at one position per pixel, the total number of voltage waveforms (corresponding to the number of pixels here) in the basic scanning area A is equal to (45/0.1)×(3/0.3)=4500. The data acquisition time of scanning the electron beam over the basic scanning area A at a time is equal to 0.0001 ms×4500 =0.45 ms. When the scanning with electron beam is repeated twenty times for the basic scanning area A (i.e., twenty pieces of data are acquired for one position of each pixel), the data acquisition time is equal to 0.45 ms×20=10 ms. This result reveals that the voltage waveform is produced at one position of each pixel for a period of 10 ms. Since five electron guns are provided in this embodiment, the total scanning range of the electron guns is equal to (180×5)×680=900×680 $mm^2$. In the scanning area by each electron gun contains 180×680/(45×3)=908 basic scanning areas A having a size of 3×45 $mm^2$. Accordingly, the total data acquisition time for the entire area of the glass substrate is equal to 908×0.01 s=about 9 seconds.

In the case where the voltage waveforms are obtained at a total of four positions including two positions in length and width per pixel to test the state of the pixel, the total data acquisition time for the entire area of the glass substrate is equal to 908×1.8 ms×20=about 32.7 seconds. Thereby, the testing time can be five times shorter than when one electron gun is provided.

With the testing apparatus and method according to the second embodiment of the invention, the total data acquisition time or the testing time over the entire area of the TFT substrate can be further shorter by using a plurality of electron guns scanning the electron beam in the corresponding basic scanning areas.

In the second embodiment of the invention, every time each electron gun finish scanning the electron beam in the basic scanning area A, the stage is moved and the electron gun is placed at a position corresponding to the next basic scanning area A. However, besides that, every time the scanning of the electron beam over the basic scanning area A is ended, each electron gun and each secondary electron detector can be moved separately, or a plurality of electron guns and a plurality of secondary electron detectors can be moved integrally under the control of a control device. Further, five electron guns and secondary electron detectors are employed in the second embodiment of the invention, but other number of electron guns and secondary electron detectors may be employed.

In the first and second embodiments of the invention, the electron gun is fixed in each basic scanning area to scan the electron beam. Every time the scanning of the electron beam over each basic scanning area is ended, the stage is moved and the electron gun scans the electron beam in the basic scanning area in succession, the data over the entire area of the TFT substrate is acquired. However, besides that, the electron gun may scan the electron beam in the basic scanning area, while the stage is being moved at any time. In this case, it is unnecessary to move the stage every time the scanning of the electron beam over each basic scanning area is ended, as described below, whereby there is no need of including the time necessary for accelerating or decelerating the stage.

An apparatus for testing plural pixels arranged in a matrix array by scanning the electron beam using a plurality of electron guns while moving a stage according to a third embodiment of the invention will be described below. The testing apparatus according to the third embodiment of the invention is different from that of the second embodiment only in the respect that the stage is always moved while scanning the electron beam with a plurality of electron guns. Incidentally, the testing apparatus has the same constitution as that of the testing apparatus of the second embodiment. Hence, the same or like parts are designated by the same numerals and the description of those parts is omitted.

The testing apparatus according to the third embodiment of the invention comprises five electron guns 1A, 1B, 1C, 1D and 1E for incidenting the electron beam to the TFT substrate 11, five secondary electron detectors 3A, 3B, 3C, 3D and 3E, provided corresponding to the electron guns 1A, 1B, 1C, 1D and 1E, for detecting the amount of secondary electrons generated by irradiation of the TFT substrate 11 with the electron beam 22, and the stage 2 for carrying the TFT substrate 11 that is held thereon in the same manner as in the second-embodiment as shown in FIG. 2. The electron guns 1A, 1B, 1C, 1D and 1E are spaced apart by 180 mm.

The electron guns 1A, 1B, 1C, 1D and 1E are disposed against the TFT substrate 11 held on the stage 2 and scan the electron beam in the basic scanning area A of 3×45 $mm^2$ repeatedly. The stage 2 is always moved in an opposite direction to the testing direction (indicated by the arrow of the dotted line in the figure) with the TFT substrate 11 held, while each of the electron guns 1A, 1B, 1C, 1D and 1E scans the electron beam over the basic scanning area A.

Referring to FIGS. 3A to 3D, the stage 2 is moved in the opposite direction to the testing direction at such a speed that the electron guns 1A, 1B, 1C, 1D and ME are placed at the positions corresponding to the next basic scanning area A, when the electron guns 1A, 1B, 1C, 1D and 1E finish scanning the electron beam in the basic scanning area A. For example, consider that pixels of 300×100 $\mu m^2$ are arranged in a matrix array in the basic scanning area A of 3×45 $mm^2$. Supposing that the interval of electron beam radiation is 0.1 $\mu s$, and the scanning of the electron beam over the basic scanning area A is repeated twenty times, when the voltage waveform is obtained at a total of four positions per pixel, the stage 2 is always moved at a speed of (basic scanning area A length of 3 mm)/(total data acquisition time for basic scanning area of 36 ms)=83 m/s.

Figure 5:
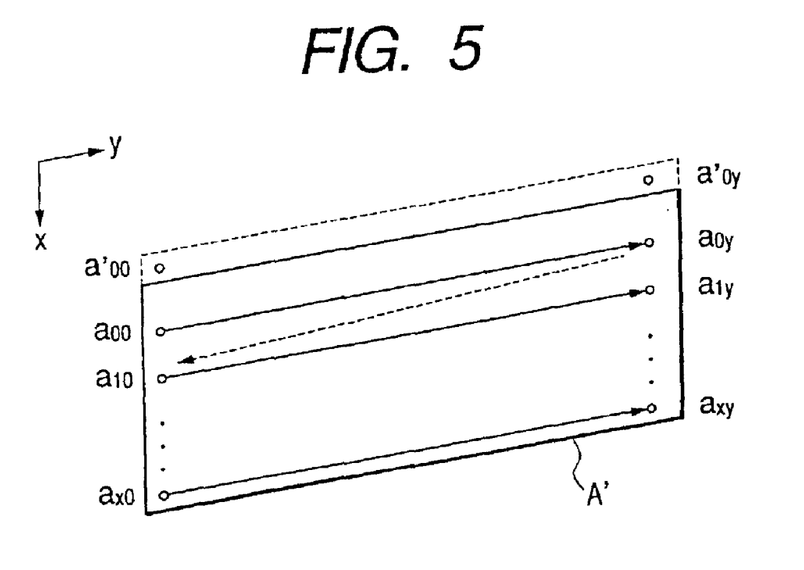
FIG. 5 is a drawing for explaining an electron beam scanning method for scanning the basic scanning area A when the stage is always moved.

Referring now to FIG. 5, a method for scanning the electron beam over the basic scanning area A using the electron guns 1A, 1B, 1C, 1D and 1E will be described below. In FIG. 5, the scanning range A' indicates the scanning area of the electron beam on the TFT substrate 11, as looked from the electron guns 1A, 1B, 1C, 1D and 1E.

In this embodiment, the stage 2 is always moved while the electron guns 1A, 1B, 1C, 1D and 1E scan the electron beam. Accordingly, to irradiate the irradiating positions $a_{00}$ to $a_{xy}$ of the scanning range A as shown in FIG. 1B on the TFT substrate 11, it is required that the electron guns 1A, 1B, 1C, 1D and 1E radiate the electron beam at irradiating positions $a_{00}$ to $a_{xy}$ in the parallelogram scanning range A', as shown in FIG. 5.

That is, the electron guns 1A, 1B, 1C, 1D and 1E scan the electron beam from the irradiating position $a_{00}$ at the first row and first column to the irradiating position $a_{0y}$ at the y column in the right upper direction in the figure. If the scanning for the first line is ended, the electron guns 1A, 1B, 1C, 1D and 1E return to the irradiating position $a_{10}$ at the second row and first column, and scan the electron beam from the irradiating position $a_{10}$ at the second row and first column to the irradiating position $a_{1y}$ at they column in the right upper direction in the figure. By repeating this operation, the scanning of the electron beam is performed over the entire area of the scanning area A'. Thereby, the region from the irradiating position $a_{00}$ to the irradiating position $a_{xy}$ in the basic scanning area A is irradiated with the electron beam on the TFT substrate 11, as shown in FIG. 1B.

Also, the electron guns 1A, 1B, 1C, 1D and 1E scan the electron beam over one scanning area A' repeatedly a predetermined number of times, preferably, twenty times or more, to obtain the secondary electron wave form necessary for testing the presence/absence of a defect in the pixel. The start position of scanning the electron beam over this scanning area A' each time is shifted by an amount of stage movement in a movement direction of the stage from the previous irradiation position $a_{00}$ for scanning the electron beam, and becomes the position ($a'_{00}$).

With the testing apparatus and method according to the third embodiment of the invention, each of the electron guns scans the electron beam over the basic scanning area continuously while the stage is always moved, whereby there is no need of including the acceleration or deceleration time of the stage, so that the total testing time over the entire area of the TFT substrate can be further shorter. Since there is a great difference between the movement speed of the stage 2 and the electron irradiation time, the influence of a testing error due to the movement of the stage 2 can be negligible.

Figure 6:
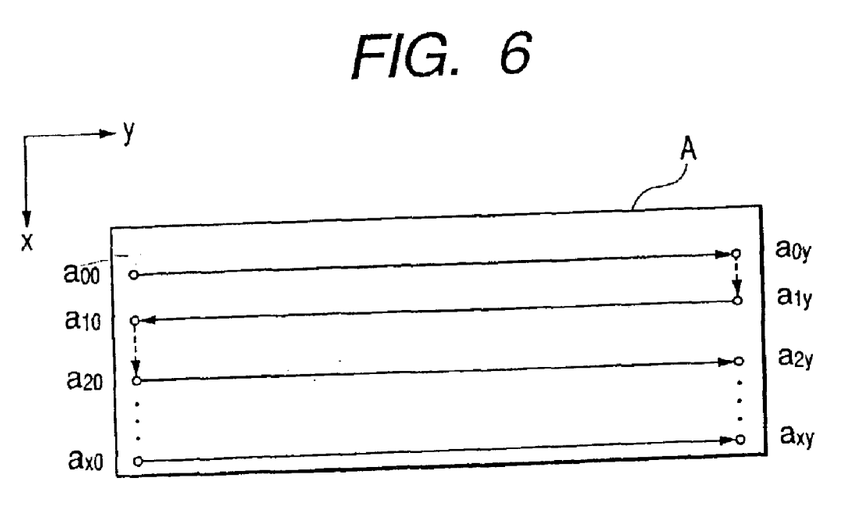
FIG. 6 is a drawing for explaining another example of the electron beam scanning method for scanning the basic scanning area according to the invention.

The method for scanning the electron beam according to the first to third embodiments of the invention as described above involves scanning the electron beam in one direction from one end of the basic scanning area to the other end, like the method for scanning the electron beam with the cathode-ray tube for the television, as shown in FIGS. 1B and 5. However, besides that, another scanning method as shown in FIG. 6 may be employed. Namely, the electron guns 1A, 1B, 1C, 1D and 1E scan the electron beam from the irradiating position $a_{00}$ (left upper end in the figure) at the first row and first column to the irradiating position $a_{0y}$ at the y-th column in the right direction, then moves to the irradiating position $a_{1y}$ at the second row and y-th column (right end below $a_{0y}$ in the figure), and scan the electron beam from the irradiating position $a_{10}$ at the second row and first column to the irradiating position $a_{20}$ (left end below $a_{10}$) at the third row and first column in the left direction, as shown in FIG. 6. By repeating this operation, the scanning of the electron beam over the entire area of the basic scanning area A is made.

This scanning method can further shorten the testing time as compared with the scanning method of FIG. 1B, because a return time (i.e., from the irradiating position $a_{00}$ at the first row and first column back to the irradiating position $a_{10}$ at the second row and first column, or from the irradiating position $a_{xy}$ at the x-th row and y-th column back to the irradiating position $a_{00}$ at the first row and first column) is unnecessary.

The scanning method of the electron beam according to the first to third embodiments as described above may be combined with various voltage applying methods of pixels. Thereby, it is possible to test various sorts of defects in the pixels at high speed. One example of the voltage applying method of pixels can be presented.

Figure 7A:
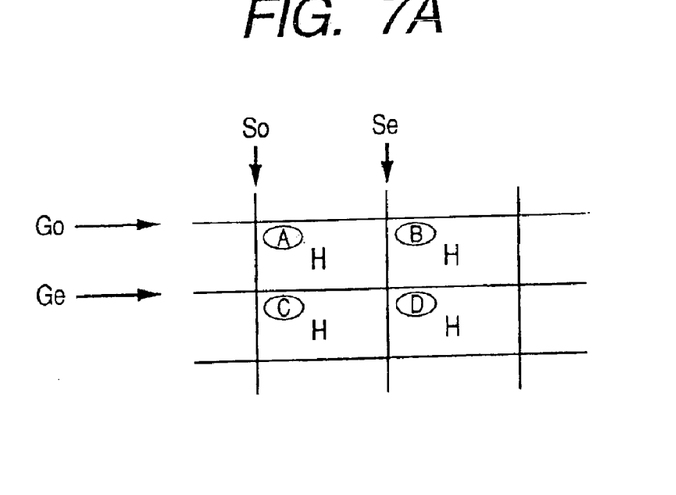
FIGS. 7A and 7B are charts for explaining one example of a method for applying a voltage to the pixel.
Figure 7B:
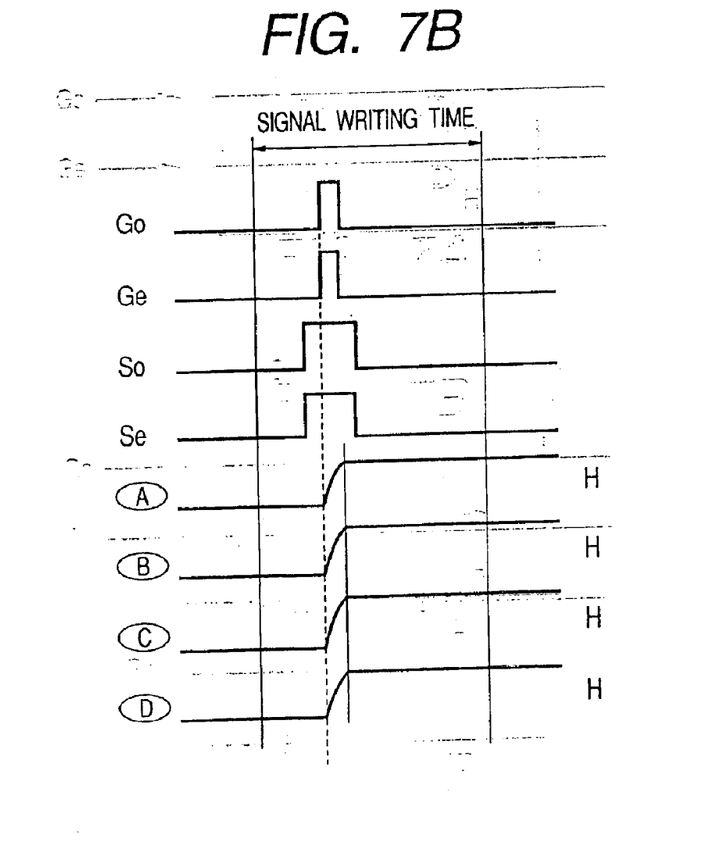
Figure 8A:
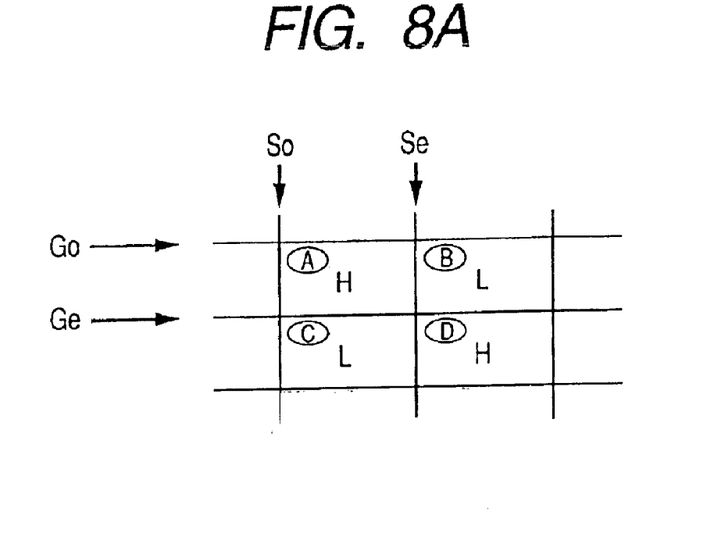
FIGS. 8A and 8B are charts for explaining another example of the method for applying a voltage to the pixel.
Figure 8B:
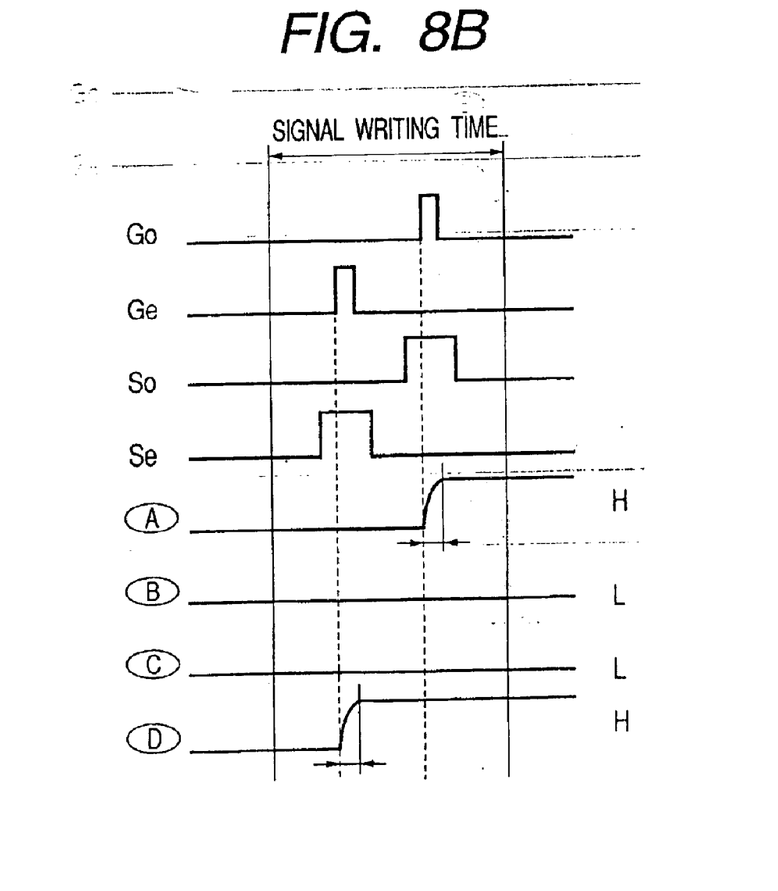
Figure 9A:
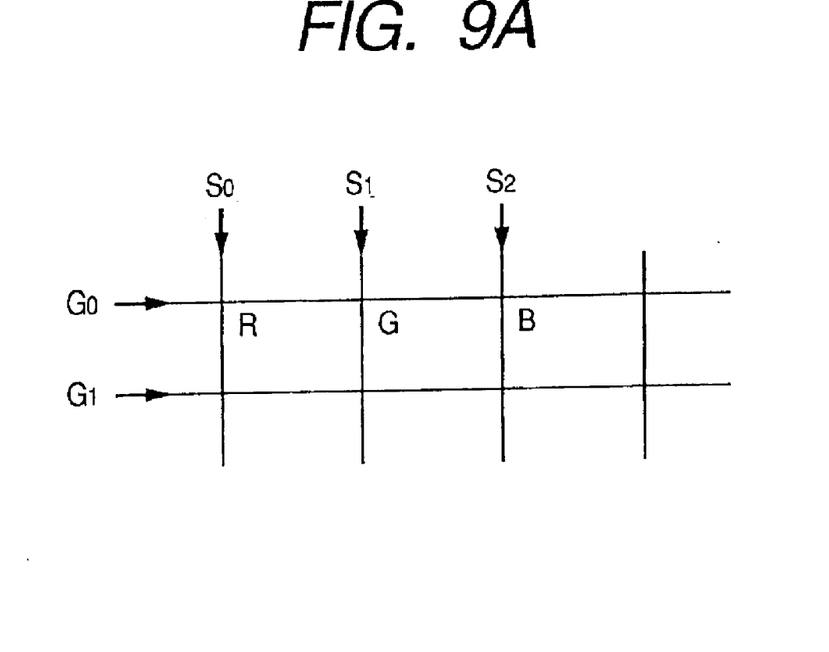
FIGS. 9A and 9B are charts for explaining still another example of the method for applying a voltage to the pixel.
Figure 9B:
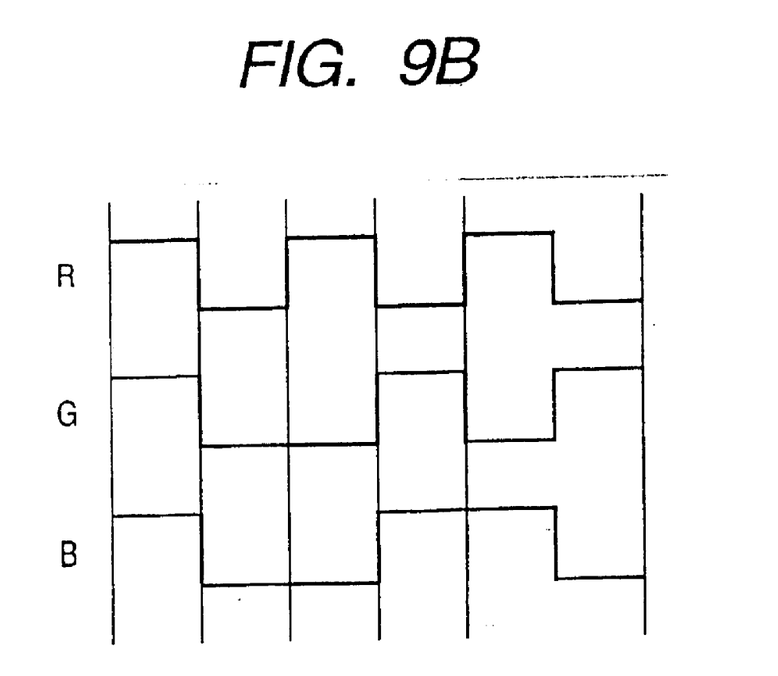

FIGS. 7A and 7B are drawings for explaining a voltage applying method for driving all the pixels on the TFT substrate at the voltage of same polarity. FIGS. 8A and 8B are drawings for explaining the voltage applying method for driving adjacent pixels at the voltage of different polarity. FIGS. 9A and 9B are drawings for explaining the voltage applying method for driving the pixels corresponding to R, G and B separately.

First of all, a first voltage applying method involves supplying the common drive signals as shown in FIG. 7B to the source electrodes (So and Se) and the gate electrodes (Go and Ge) for all the pixels on the TFT substrate, as shown in FIG. 7A. Then, the pixel electrodes (A, B, C and D) for all the pixels are driven at the voltage of the same polarity, so that this voltage value is maintained till the next refresh cycle (i.e., supply of the next drive signal), as shown in FIG. 7B. This voltage applying method has no need of controlling the supply of drive signals for individual pixels because the common drive signal is supplied to each pixel. Accordingly, briefly, all the pixels on the TFT substrate can be driven.

However, with this voltage applying method, the defect can not be detected, when adjacent pixel electrodes (e.g., electrode A and electrode B, or electrode A and electrode C) are short-circuited. Namely, in the case where the drive signals are supplied to the source electrode and the gate electrode so that all the pixel electrodes are normally driven at +5V (volt), each pixel electrode is driven at +5V (volt), even if adjacent electrodes are short-circuited. Accordingly, it is not possible to detect a short-circuit between adjacent pixel electrodes, because this state is not different from a normally driven state.

A second voltage applying method to solve this problem involves driving adjacent pixel electrodes at the voltage of different polarity.

That is, a drive signal is supplied to a gate electrode Go at the odd number and a gate electrode Ge at the even number at a different timing, as shown in FIGS. 8A and 8B. Similarly, a drive signal is supplied to a source electrode So at the odd number and a source electrode Se at the even number at a different timing. Thereby, adjacent pixel electrodes (e.g., electrode A and electrode B, or electrode A and electrode B) are driven at the voltage of different polarity, as shown in FIG. 8B. For example, in adjacent pixel electrodes A and B, suppose that the drive signals are supplied to the source electrodes and the gate electrodes so that the pixel electrode A is driven at +5V (volt) and the pixel electrode B is driven at −5V (volt) at the normal time. If the adjacent pixel electrodes are short-circuited, two pixel electrodes A and B are driven at 0V (volt), differently from the normally driven state (i.e., the pixel electrode A is at +5V (volt) and the pixel electrode B is at −5V (volt) ). Accordingly, it is possible to detect a short-circuit between adjacent pixel electrodes.

This second voltage applying method can be applied to detecting a defect in one picture element for a color liquid crystal display. In this case, different drive signals are supplied to the source electrodes (So, S1, S2) and the gate electrodes (Go, Ge) for the pixel electrode R, G and B so that three pixel electrodes corresponding to R (red), G (green) and B (blue) making up one picture element for the color liquid crystal display are driven separately, as shown in FIG. 9B.

The supply of the drive signals to the source electrode and the gate electrodes with the voltage applying method as described above is synchronized with the timing of scanning the electron beam from the electron gun, the supply of the drive signals to the source electrodes and the gate electrodes is made (i.e., the polarity of the drive voltage of the pixel electrode is changed) during a period while the electron beam from the electron gun is not radiated. This drive signal supply period is referred to as a "signal writing time SWT".

In the testing apparatus according to this invention, the signal writing time SWT is set-up, even time the scanning of the electron beam over the basic scanning area is ended, whereby the supply of the drive signals to the source electrodes and the gate electrodes is made within the desired signal writing time. Because the actual TFT has a time constant of charge and a time constant to charge the substrate as a whole. Therefore, neither the scanning of the electron beam nor the sampling are made during the writing time. Herein, since this signal writing time SWT is 300 $\mu$s, for example, the time required to make each scanning of the electron beam over one basic scanning area A is equal to 1.8 ms+300 $\mu$s=2.1 ms in the above embodiments.

This invention is not limited to the above embodiments, but any combination of those embodiments may be employed. The voltage applying method of pixel is only exemplary, and not limited to the above methods, but any combination of those methods may be used.

What is claimed is:

1. A method for testing pixels arranged in a matrix array on a substrate, including:
    setting a scanning area of said substrate, said scanning area containing a plurality of pixels;
    scanning said plurality of pixels of said scanning area at least once by sequentially irradiating each of said plurality of pixels in said scanning area with an electron beam form an electron beam source unit;
    detecting secondary electrons generated by irradiating said plurality of pixels with said electron beam; and
    relatively moving said electron beam source unit and said substrate,
    wherein said scanning area setting step includes setting a plurality of scanning areas on said substrate, each of said plurality of scanning areas containing a plurality of pixels, and every time said scanning step and said detecting step are ended for each of said plurality of scanning areas, said relative movement step is made to perform said scanning step and said detecting step for other scanning areas.

2. The testing method according to claim 1, wherein said scanning step includes applying the electron beam to a plurality of different irradiation positions within each of said plurality of pixels.

3. The testing method according to claim 1, wherein said scanning area setting step includes setting a plurality of scanning areas on said substrate, each of said plurality of scanning areas containing a plurality of pixels, and said scanning step includes enabling a plurality of the electron beam source units to scan said plurality of scanning areas corresponding to said plurality of the electron beam source units.

4. The testing method according to claim 1, wherein each of said pixels has a size of 300×100 $\mu m^2$, and irradiation of said pixels with the electron beam is made for every interval of 300 $\mu$m/2 in vertical and 100 $\mu$m/2 in horizontal.

5. The testing method according to claim 1, wherein said substrate is a TFT substrate on which pixels having a TFT and a pixel electrode are arranged in a matrix array on a glass substrate.

6. The testing method according to claim 1, further including:
    supplying a drive signal to the plurality of pixels in said scanning area,
    wherein said scanning step includes scanning each of the plurality of pixels in said scanning area driven at said drive signal supplying step multiple times, each scanning being made in succession via a writing time.

7. The testing method according to claim 6, wherein said drive signal supplying step includes supplying a drive signal to the pixels in said scanning area within said writing time.

8. A method for testing pixels arranged in a matrix array on a substrate, including:
    setting a scanning area of said substrate, said scanning area containing a plurality of pixels;
    scanning said plurality of pixels of said scanning area at least once by sequentially irradiating each of said plurality of pixels in said scanning area with an electron beam form an electron beam source unit;
    detecting secondary electrons generated by irradiating said plurality of pixels with said electron beam; and
    relatively moving said electron beam source unit and said substrate,
    wherein said scanning area setting step includes setting a plurality of scanning areas on said substrate, each of said plurality of scanning areas containing a plurality of pixels, and said relative movement step moves said substrate relative to said electron beam source unit, while performing said scanning step for each of said plurality of scanning areas.

9. An apparatus for testing pixels arranged in a matrix array on a substrate, comprising:
    an electron beam source unit for incidenting an electron beam to a scanning area on said substrate to scan said scanning area at least once, said scanning area containing a plurality of pixels;
    a secondary electron detector for detecting secondary electrons generated from said plurality of pixels by irradiation with said electron beam; and
    a stage for carrying said substrate held on an upper face thereof,
    wherein said electron beam source unit scans a plurality of scanning areas set on said substrate, each of said plurality of scanning areas containing a plurality of pixels, and every time said electron beam source unit finishes scanning one of said scanning areas, at least one of said electron beam source unit and said stage is moved.

10. An apparatus for testing pixels arranged in a matrix array on a substrate, comprising:
    an electron beam source unit for incidenting an electron beam to a scanning area on said substrate to scan said scanning area at least once, said scanning area containing a plurality of pixels;
    a secondary electron detector for detecting secondary electrons generated from said plurality of pixels by irradiation with said electron beam; and
    a stage for carrying said substrate held on an upper face thereof,
    wherein while said electron beam source unit scans said scanning area, at least one of said electron beam source unit and said stage is moved.

11. The testing apparatus according to claim 10, wherein said electron beam source unit incidents the electron beam to a plurality of different irradiation positions within each of said plurality of pixels.

12. The testing apparatus according to claim 10, wherein said electron beam source unit scans a plurality of scanning areas set on said substrate, and wherein said electron beam source unit comprises a plurality of the electron beam generators to scan said plurality of scanning areas set on said substrate, each of said plurality of scanning areas containing a plurality of pixels.

13. The testing apparatus according to claim 10, wherein each of said plurality of pixels has a size of 300×100 $\mu m^2$, and irradiation of said pixels with the electron beam is made for every interval of 300 $\mu$m/2 in vertical and 100 $\mu$m/2 in horizontal.

14. The testing apparatus according to claim 10, wherein said substrate is a TFT substrate on which the pixels having a TFT and a pixel electrode are arranged in a matrix array on a glass substrate.

15. The testing apparatus according to claim 10, further comprising:
  a drive signal source unit for supplying a drive signal to the plurality of pixels in said scanning area,
  wherein said electron beam source unit scans each of the plurality of pixels in said scanning area driven by said drive signal source unit multiple times, each scanning being made in succession via a writing time.

16. The testing apparatus according to claim 15, wherein said drive signal source unit supplies a drive signal to the pixels in said scanning area within said writing time.

* * * * *